United States Patent
Gudesen et al.

(10) Patent No.: US 6,937,500 B2
(45) Date of Patent: Aug. 30, 2005

(54) METHOD FOR OPERATING A FERROELECTRIC OF ELECTRET MEMORY DEVICE, AND A DEVICE OF THIS KIND

(75) Inventors: Hans Gude Gudesen, Brussels (BE); Per-Erik Nordal, Asker (NO); Geirr I. Leistad, Sandvika (NO); Per Bröms, Linköping (SE); Per Sandström, Linköping (SE); Mats Johansson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/659,428

(22) Filed: Sep. 11, 2003

(65) Prior Publication Data

US 2005/0073869 A1 Apr. 7, 2005

(30) Foreign Application Priority Data

Sep. 11, 2002 (NO) .......................................... 20024335

(51) Int. Cl.⁷ .............................................. G11C 11/22
(52) U.S. Cl. .................. 365/145; 365/189.01; 365/222
(58) Field of Search ........................... 365/145, 189.01, 365/222, 233, 189.09, 65

(56) References Cited

U.S. PATENT DOCUMENTS

| | | | |
|---|---|---|---|
| 5,487,029 A | | 1/1996 | Kuroda |
| 5,777,921 A | * | 7/1998 | Takata et al. ................ 365/145 |
| 6,272,037 B1 | | 8/2001 | Miyamoto |
| 6,392,916 B1 | | 5/2002 | Choi et al. |
| 6,606,261 B2 | | 8/2003 | Gudeson et al. |
| 2002/0024837 A1 | | 2/2002 | Iwanari |
| 2002/0060923 A1 | | 5/2002 | Thompson et al. |

FOREIGN PATENT DOCUMENTS

| | | |
|---|---|---|
| JP | 10083679 A | 3/1998 |
| JP | 2002313076 A | 10/2002 |
| NO | 312698 B1 | 1/2002 |
| NO | 312699 B1 | 1/2002 |
| NO | 20003507 | 1/2002 |
| NO | 20003508 | 1/2002 |
| WO | WO 02/05287 A1 | 1/2002 |

* cited by examiner

*Primary Examiner*—David Lam
(74) *Attorney, Agent, or Firm*—Birch, Stewart, Kolasch & Birch, LLP

(57) ABSTRACT

A matrix-addressable ferroelectric or electret memory device and a method of operating are explained. The method includes applying a first plurality of voltage difference across a first and a second set of electrodes in the memory when data are read, and applying a second plurality of voltage differences when data are refreshed or rewritten. The first and second plurality of voltage differences correspond to sets of potential levels comprising time sequences of voltage pulses. At least one parameter indicative of a change in a memory cell response is used for determining at least one correction factor for the voltage pulses, whereby the pulse parameter is adjusted accordingly. The memory device comprises means for determining the at least one parameter, a calibration memory connected with means for determining the correction factor, and control circuits for adjusting pulse parameters as applied to read and write operations in the memory device.

28 Claims, 8 Drawing Sheets

Figure 1:
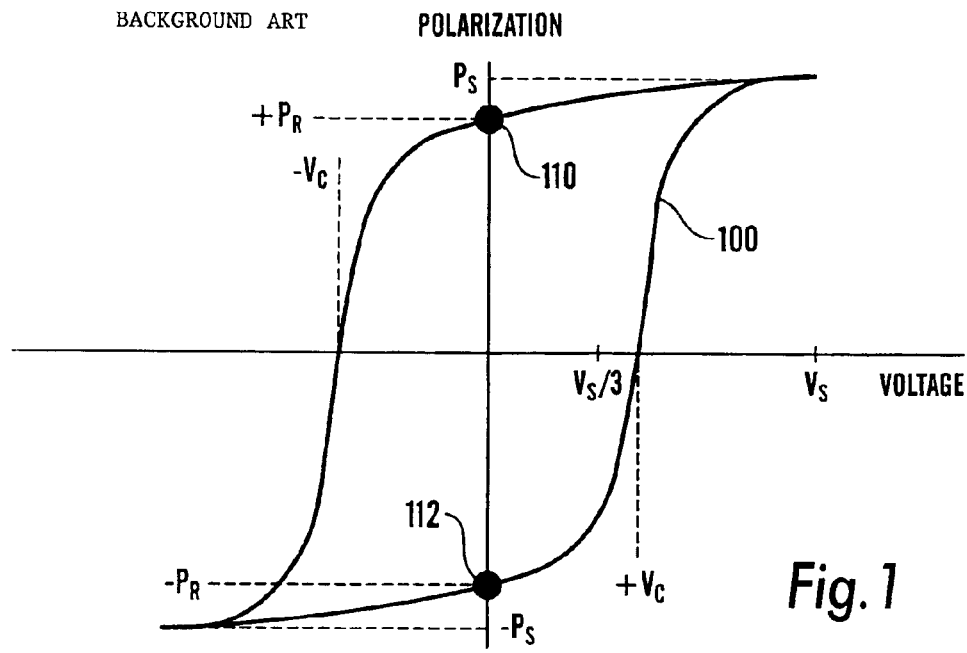

METHOD FOR OPERATING A FERROELECTRIC OF ELECTRET MEMORY DEVICE, AND A DEVICE OF THIS KIND

This nonprovisional application claims priority under 35 U.S.C. § 119(a) on Patent Application No(s). 20024335 filed in NORWAY on Sep. 11, 2002, which is (are) herein incorporated by reference.

The present invention concerns a method for operating a ferroelectric or electret memory device, wherein the memory device comprises memory cells in the form of a ferroelectric or electret thin-film polarizable material exhibiting hysteresis, particularly a ferroelectric or electret polymer thin film, and a first and a second set of respective parallel electrodes, wherein the electrodes of the first set are provided in substantially orthogonal relationship to the electrodes of the second set, wherein the electrodes of said first and second set are provided in direct or indirect contact with the thin-film material of the memory cells, whereby a polarization state in individual memory cells can be read, refreshed, erased or written by applying appropriate voltages to the individual electrodes of respectively said first and second set of electrodes, wherein the method implements a voltage pulse protocol comprising a read and write/refresh cycle respectively with time sequences of voltage pulses of predefined amplitudes and lengths, wherein a read cycle comprises applying a set of voltage differences to electrodes of respectively said first and second set of electrodes in case data are read out from the memory cells, and wherein the write/refresh cycle of the voltage pulse protocol comprises applying another set of voltage differences to electrodes of respectively said first and second set of electrodes in case data are written/refreshed to said memory cells, said sets of voltage differences corresponding to a predefined set of potential levels such that the predefined set of potential levels has at least three separate values.

The invention also concerns a ferroelectric or electret memory device for implementing the method according to the present invention, wherein the memory device comprises memory cells in the form of a ferroelectric or electret thin-film polarizable material exhibiting hysteresis, particularly a ferroelectric or electret polymer thin film, and a first and a second set of respective parallel electrodes, wherein the electrodes of the first set are provided in substantially orthogonal relationship to the electrodes of the second set, wherein the electrodes of said first and second set are provided in direct or indirect contact with the thin-film material of the memory cells, whereby a polarization state in individual memory cells can be read, refreshed, erased or written by applying appropriate voltages to the individual electrodes of respectively said first and second set of electrodes, and wherein a driver control unit is provided for applying via driver circuits a predefined set of potential levels to the electrodes for effecting the above-mentioned operations on selected memory cells according to a voltage pulse protocol for read and write/refresh operations.

Ferroelectrics are electrically polarizable materials that possess at least two equilibrium orientations of the spontaneous polarization vector in the absence of an external electrical field, and in which the spontaneous polarization vector may be switched between those orientations by an electric field. The memory effect exhibited by materials with such bistable states of remanent polarization can be used in memory applications. One of the polarization states is considered to be a logic "1" and the other state a logic "0". Typical passive matrix-addressing memory applications are implemented by letting two sets of parallel electrodes cross each other, normally in an orthogonal fashion, in order to create a matrix or array of cross-points that can be individually accessed electrically by selective excitation of the appropriate electrodes from the edge of the matrix. A layer of ferroelectric material is provided between or over the electrode sets such that the capacitor-like structures (functioning as memory cells) are formed in the material between or at the crossings of the electrodes. When applying potential differences between two electrodes, the ferroelectric material in the cell is subjected to an electric field which generates a polarization response generally tracing a hysteresis curve or a portion thereof. By manipulating the direction and the magnitude of the electric field, the memory cell can be left in a desired logic state. The passive addressing of this type of arrangement leads to simplicity of manufacture and a high density of cross-points.

Referring to FIG. 1, a material with a hysteresis loop 100 changes its polarization direction upon application of an electric field that exceeds the coercive field $E_C$. The hysteresis loop is shown with the voltage rather than the field along the abscissa axis for reasons of convenience. The voltage is calculated by multiplying the field with the thickness of the ferroelectric material layer. A saturation polarization $P_S$ is obtained whenever a memory cell is subject to the nominal switching voltage, $V_S$. However, in practice, partial switching will take place upon application of electric fields below this value. The extent of the partial switching depends on the material properties, but repeated application of electric fields, even if lower than the coercive field, will ultimately degrade the remanent polarization states $+P_R$ 110 and $-P_R$ 112 to the extent that erroneous read results may occur later on. It is the switching protocol, also known as voltage pulse protocol, that determines the electric fields, by applying voltages to the memory array during read and write operations. An appropriate switching protocol is needed in order to avoid disturbing other cells when an individual cell in a memory array is read or written. To this end the voltage pulse protocol prescribes and applies predetermined voltage levels to the electrodes to select a memory cell for addressing and perform an addressing operation, while at the same time keeping the disturb of non-selected cells at a minimum. A plurality of voltage pulse protocols have been developed to lessen this latter effect. A few examples can be found in U.S. Pat. No. 3,002,182 (Andersson), U.S. Pat. No. 4,169,258 (Tannas Jr.) and the published International Patent Application No. WO 02/05287 (Thompson et al.).

Ferroelectric and electret materials generally exhibit a polarization behaviour dependent on environmental factors and also the addressing history. This may pose a problem when these materials are employed in memory devices that are exposed to different ambient and operating conditions. In that connection it should be noted that ferroelectric materials properly form a subclass of the electrets and are distinguished by being permanently polarizable to either of two permanent polarization states and exhibiting hysteresis. In the following discussion of prior art as well as of preferred embodiments of the invention the memory material shall in order to ease the understanding of the invention generally be regarded and denoted as ferroelectric, thus exhibiting both hysteresis and dipolar polarization behaviour.

Figure 2:
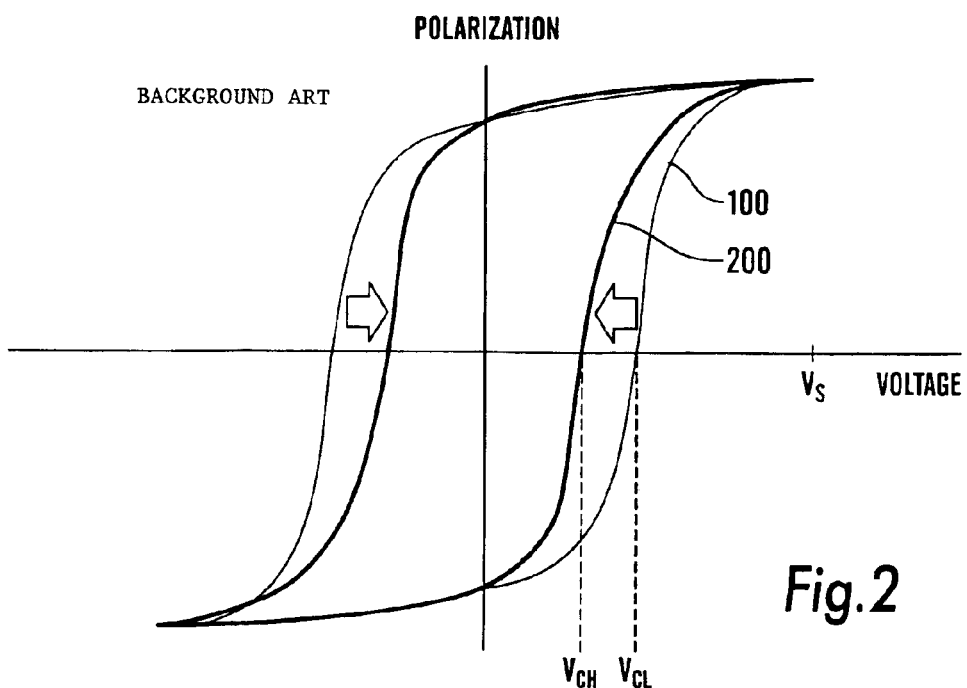

Particularly the polarization behaviour can be influenced by the ambient temperature to which the ferroelectric material is subjected. Most ferroelectric materials undergo a structural phase transition from a high-temperature non-ferroelectric phase into a low-temperature ferroelectric phase. This transition occurs at a temperature $T_C$ called the Curie point. Lead titanate zirconate, a popular inorganic ferroelectric material, has a Curie temperature of 360° C. The operating temperature of a ferroelectric memory array is normally significantly lower than this and hence poses fewer and smaller problems, if any. If the ferroelectric material is a polymer, however, an increase in the temperature of the polymer, or an increase in the device working temperature, becomes an important factor of disturbance. FIG. 2 demonstrates one possible effect of an increased temperature on the hysteresis curve 100. The smaller curve represents the ferroelectric properties of a material at a higher temperature. An increased sensitivity to the electric field can be noted since the coercive voltage at a lower temperature, $V_{CL}$, is higher than the coercive voltage at a higher temperature, $V_{CH}$. If the electric field applied remains unadjusted in spite of a temperature change, the voltage over non-addressed cross-points would increase the risk of an undesired reversal of the polarization direction. Also the switching speed of a ferroelectric memory material will generally be dependent upon its temperature and increases as the temperature becomes higher.

The well-known fact that the hysteresis curve has a temperature dependency is acknowledged in U.S. Pat. No. 5,487,029 (Kuroda). In order to prevent undesired erroneous writing in a ferroelectric memory due to a temperature change, Kuroda states that it is necessary to adjust a write voltage with a negative temperature dependency which corresponds to the temperature characteristics of the hysteresis curve. To this end Kuroda teaches the use of a voltage generator for providing a write voltage which is stabilized by a zener diode with negative temperature characteristics. The zener diode hence adjusts the write voltage and adapts it to the negative temperature dependency of the ferroelectric capacitors. However, it is a difficult task to tune the characteristics of a zener diode with negative characteristics to the temperature characteristics of the hysteresis curve of a ferroelectric memory material, and Kuroda admits that the temperature compensation may resort to other methods than this, but gives no indication of suitable alternatives.

It should be noted that prior art in this field has been developed in the context of inorganic ceramic ferroelectric materials which typically retain their physical integrity and ferroelectric viability in a temperature range which vastly exceeds that encountered in practical memory devices. An example is lead zirconate titanate, PZT, which has a Curie point at 360° C., above which the spontaneous polarization vanishes. In contrast to this there is an emerging class of memory devices based in ferroelectric organic polymers with Curie and/or melting temperatures below 200° C. These materials offer very considerable advantages in terms of processability, cost, technical flexibility etc., but in certain cases may pose problems due to a change in their electrical characteristics when the temperature varies across the range of specified operating temperatures.

However, from the present applicants' work with ferroelectric memory materials and matrix-addressable ferroelectric memory it has emerged that memory materials in the form of ferroelectric polymers do not change their switching characteristics dependent on the temperature in a straightforward manner, but that the switching characteristics of ferroelectric polymers can be dependent on changes in their operating temperature in a more complicated manner and that a temperature increase not always causes a corresponding increase in the switching speed, as might be expected. In addition it has been found that other environmental factors than the temperature may change the switching speed of the memory material. Such factors may be due to environmental influences including temperature, but not limited to that as e.g. atmospheric humidity, mechanical stresses, electrical stresses as well as the previous addressing history of memory cells made with a ferroelectric polymer influence the ferroelectric behaviour of the memory material. Generally it can be stated that a memory cell dynamic response will be dependent on a number of factors, and while it is not necessary to isolate the separate contributions from these factors, it is very clear that their overall contribution influences the dynamic aspect of the memory response in some way or other. In order to obviate such influences in an all-inclusive manner, it would be near at hand to monitor a memory cell response to an addressing operation by comparing an instant response with an empirically determined reference response, e.g. one obtained under carefully obtained conditions, and then adjust the parameters of the voltage pulse protocol as applied for addressing operations in a passive matrix addressable memory with a ferroelectric polymer as the memory material.

Specifically the voltage pulse protocol also determines the voltage levels to be applied in a timing sequence to the respective active and inactive word and bit lines during an addressing operation and hence this aspect of the voltage pulse protocol shall involve not only the pulse lengths, but also the pulse intervals. Briefly stated, the parameters of voltage pulse protocol would ceteris paribus be determined as said and set for addressing operations. The applicants' investigations have, however, made clear that a memory cell's response, as measured by an appropriate parameter, e.g. the switching speed or its time derivative, is dynamic and changes in time dependent on the various factors listed above and of which in addition to the addressing history can be of major importance. As stated, these include the memory material's actual operating temperature which imprecisely has been regarded as ambient temperature, given that the device is in thermal equilibrium, but this is not necessarily always the case. The operating temperature of e.g. a memory cell can be dependent on both ongoing addressing operations and the addressing history, as well as heat dissipated from contiguous electronic circuitry.

Thus it is a primary object of the present invention to provide a method for eliminating or reducing the problems caused by changes in the hysteresis curve, the coercive voltage, and the switching speed with regard to addressing operations in ferroelectric or electret memory devices. The primary object hence generally aims at obviating change or drift in the response of the memory cells due to environmental influences, addressing history and various stresses induced in the operation of ferroelectric or electret memories, whether the stresses are of electrical, mechanical, chemical or thermal nature, or combinations thereof.

It is also an object of the present invention to provide a method for switching speed compensation without using voltage-stabilizing circuitry that are prone to temperature effects and drift. Even more particularly it is an object of the present invention to provide a temperature compensation method applicable to the voltage pulse protocol parameters and which shall be particularly suited for use with polymer ferroelectric or electret memory materials in the form of thin films.

Finally it is an object of the present invention to provide a ferroelectric or electret memory device wherein the method of the invention can be implemented.

The above-mentioned objects as well as further features and advantages are realized according to the invention with a method which is characterized by steps for a) determining at least one parameter indicative of a change in a memory cell response to the applied voltage differences;

b) determining at least one correction factor for the voltage pulses as given by the voltage pulse protocol on the basis of said at least one parameter indicative of the change in a memory cell response to the applied voltage differences;

c) selecting for an adaptation of the voltage pulse protocol at least one of the following pulse protocol parameters, viz. pulse amplitudes, pulse lengths and pulse intervals; and d) adjusting one or more parameter values of at least one of said selected pulse protocol parameters in accordance with said at least one correction factor, whereby one or more pulse amplitudes, one or more pulse lengths, and one or more pulse intervals are adjusted either separately or in combination in accordance with a detected change in the memory cell response.

According to the invention it is in any case preferable adjusting the value of the pulse amplitude and/or the pulse length of a switching voltage in the voltage pulse protocol.

In an advantageous embodiment of the method according to the invention the at least one parameter indicative of a response change is determined in step a) by determining at least one parameter indicative of a switching speed of said ferroelectric memory, and by determining said at least one correction factor in step b) by determining a switching speed-dependent correction factor.

In this embodiment it is considered advantageous determining said at least one parameter indicative of the switching speed in step a) by measuring an instantaneous switching speed of said ferroelectric memory. Preferably can then the switching speed be measured by measuring the switching speed of one or more reference memory cells, or by analysing ongoing addressing operations including a switching of memory cells in the ferroelectric memory device.

In this embodiment it is also considered advantageous determining said at least one parameter indicative of the switching speed in step a) by continuously monitoring the switching speed of the ferroelectric memory device, applying at least one switching speed-dependent correction factor to the voltage pulse protocol implementing the applied voltage differences, adapting the voltage pulse protocol in real time to a change in the response to the applied voltage differences, and applying said real time-adapted voltage pulse protocol for adjusting at least one of the parameter values of the pulse protocol parameters in step d), and in that connection preferably adjusting all parameter values of at least one of the pulse protocol parameters in step d).

Preferably a switching speed-dependent correction factor in step b) can be determined by a calculation, or by reading of a look-up table. Alternatively a first and second switching speed-dependent correction factor may be determined in step b).

In another advantageous embodiment of the method according to the invention said at least one parameter indicative of a response change is determined in step a) by determining at least one parameter indicative of a temperature of said ferroelectric or electret memory device, and by determining said at least one correction factor in step b) by determining at least one temperature-dependent correction factor.

Preferably said at least one parameter indicative of the temperature in step a) is then determined by sensing an operating temperature of said memory device directly, and a temperature-dependent correction factor in step b) can then be determined by a calculation or by reading of a look-up table.

Alternatively a first and second temperature-dependent correction factor are determined in step b) and then the first temperature dependent correction factor is preferably determined as a temperature coefficient being applied for adjusting all parameters of at least one of the pulse protocol parameters in step d), while equally preferably then the second temperature-dependent correction factor is determined as an offset voltage, said offset voltage being applied by adjusting at least one amplitude value or a potential level in step d).

In this second embodiment it is considered advantageous adjusting parameter values in step d) by first performing a first adjustment in accordance with the first temperature-dependent correction factor and thereafter performing a second adjustment in accordance with the second temperature-dependent correction factor, or alternatively performing a first adjustment in accordance with the second temperature-dependent correction factor followed by a second adjustment in accordance with the first temperature-dependent correction factor.

In yet another advantageous embodiment of the method according to the invention said at least one parameter indicative of a response change is determined in step a) by determining at least one parameter indicative of the temperature of said memory device by measuring a switching speed of memory cells in the memory device and applying a predetermined correlation between the measured switching speed and the actual temperature of the memory material of the cells for determining the latter.

In that connection the switching speed is preferably measured by measuring the switching speed of one or more reference memory cells or by analysing ongoing addressing operations inducing a switching of memory cells in the ferroelectric memory device.

The above-mentioned objects as well as further features and advantages are also realized according to the invention with a ferroelectric memory device which is characterized in comprising means for determining at least one parameter indicative of a change in the memory cell response to the applied voltage differences, a calibration memory connected with an output of said means for determining at least one correction factor based on said parameter indicative of the change in the memory cell response, and one or more control circuits connected with an output of the calibration memory for applying an adjustment of one or more parameter values of at least one voltage pulse protocol parameter, said one or more control circuits being connected to control inputs on a memory control unit and/or a driver control unit, whereby the voltage pulse protocol with one or more parameters adjusted in accordance with the change in the memory cell response can be applied to the electrodes of the memory device via driver circuits and decoder circuits connected between the outputs of the driver control unit and the electrodes.

Preferably said means is connected with one or more pairs of reference memory cells in the memory device and equally preferably a signal analyser is provided and connected between a sense amplifier bank and the calibration memory for performing an analysis of response of the memory cells to read or write/refresh operations executed thereon.

In the ferroelectric memory device according to the invention it is considered advantageous that said means comprises a temperature sensor for sensing an operating temperature of the ferroelectric memory device, and then the temperature sensor, calibration memory and the a of driver circuits can preferably all be located within a temperature compensation circuit. In that connection the temperature compensation circuit can be an analog circuit or alternatively a digital circuit.

Figure 3:
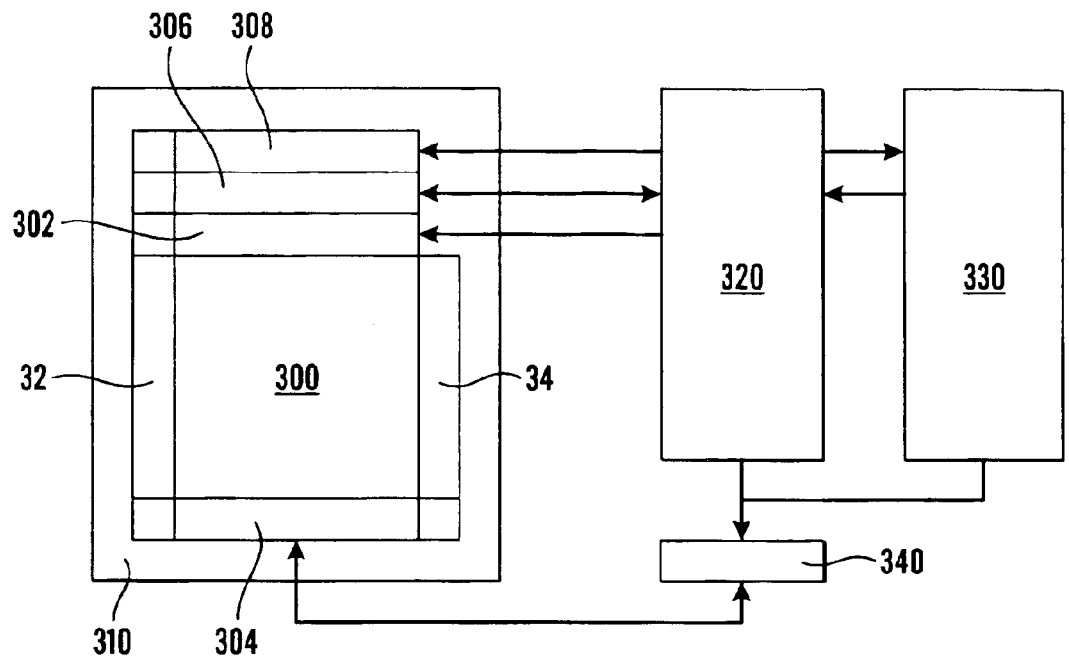
Figure 4A:
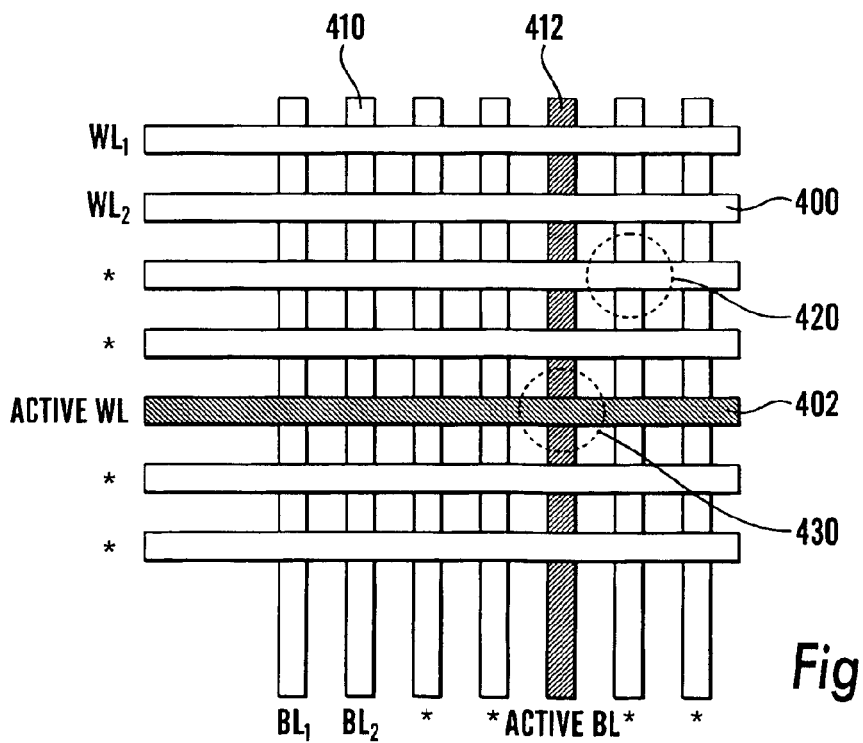
Figure 4B:
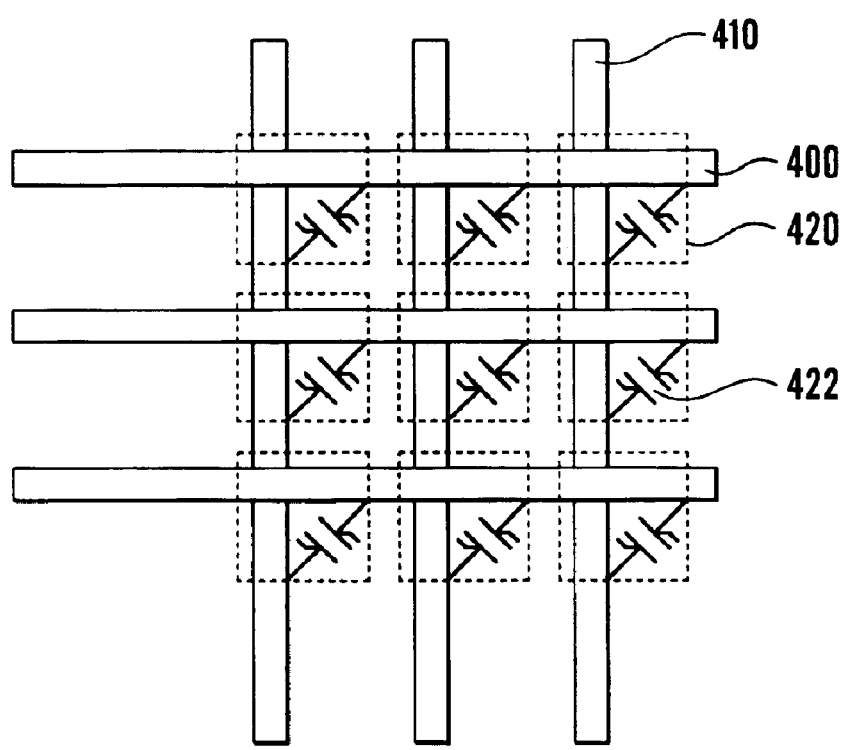
Figure 5:
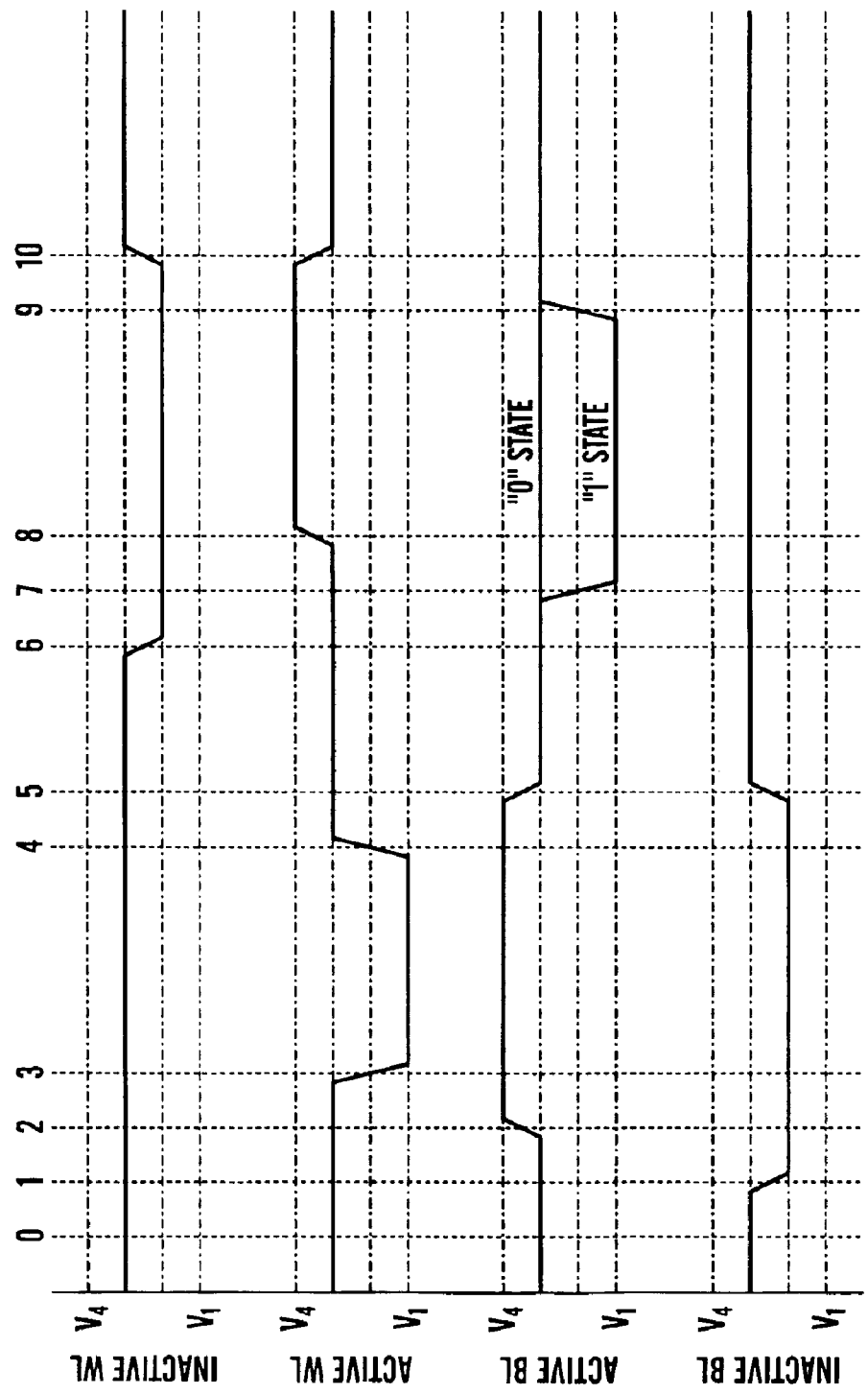
Figure 6A:
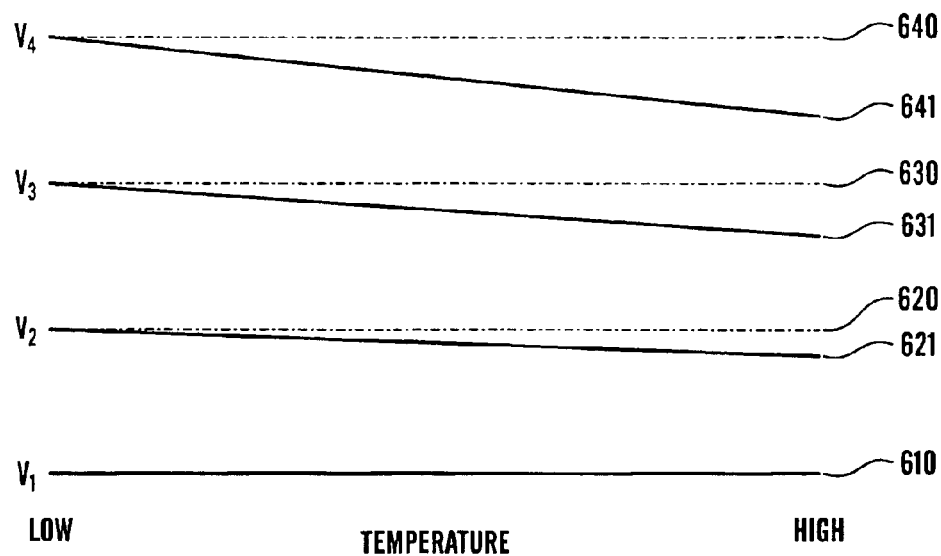
Figure 6B:
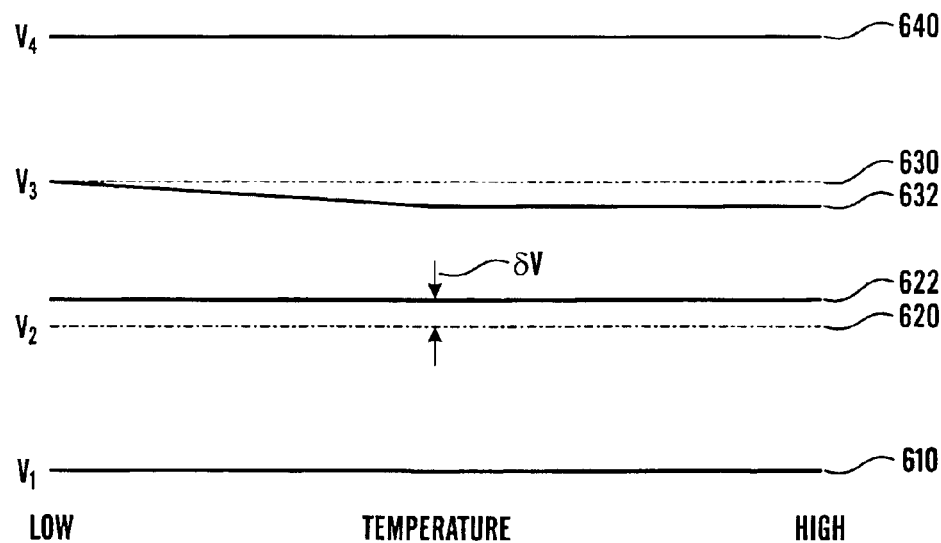
Figure 6C:
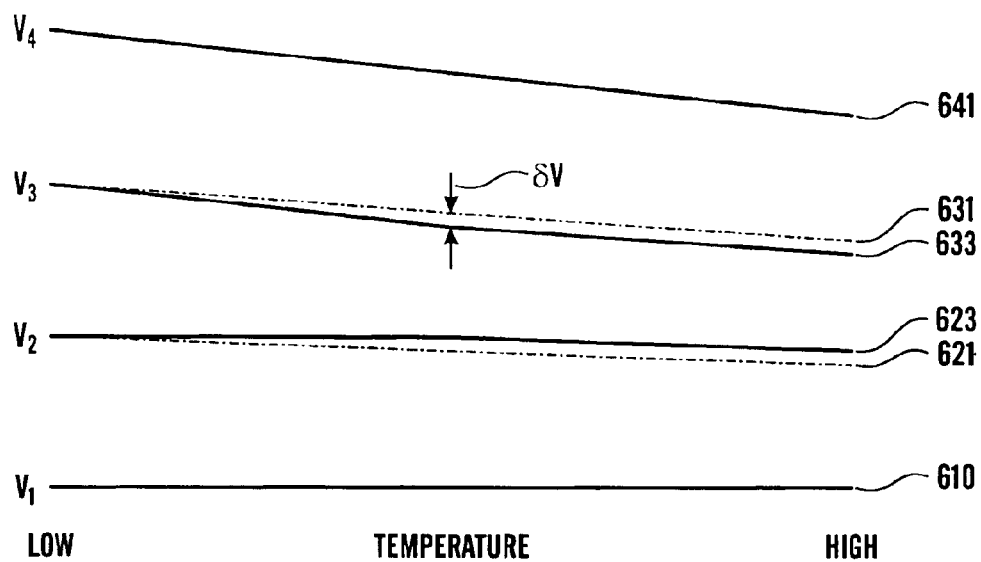
Figure 7A:
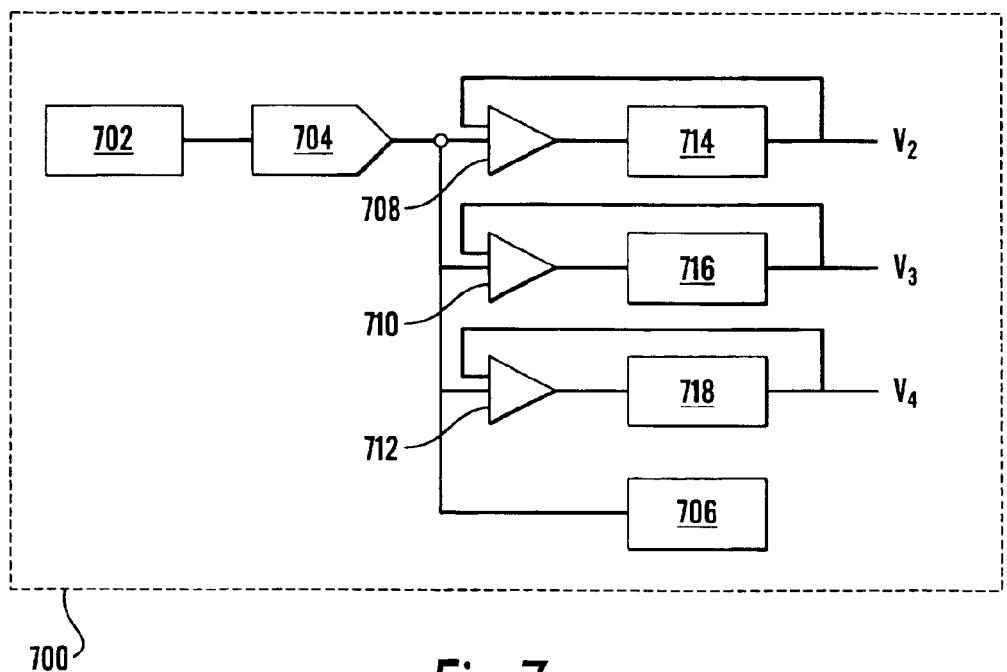
Figure 7B:
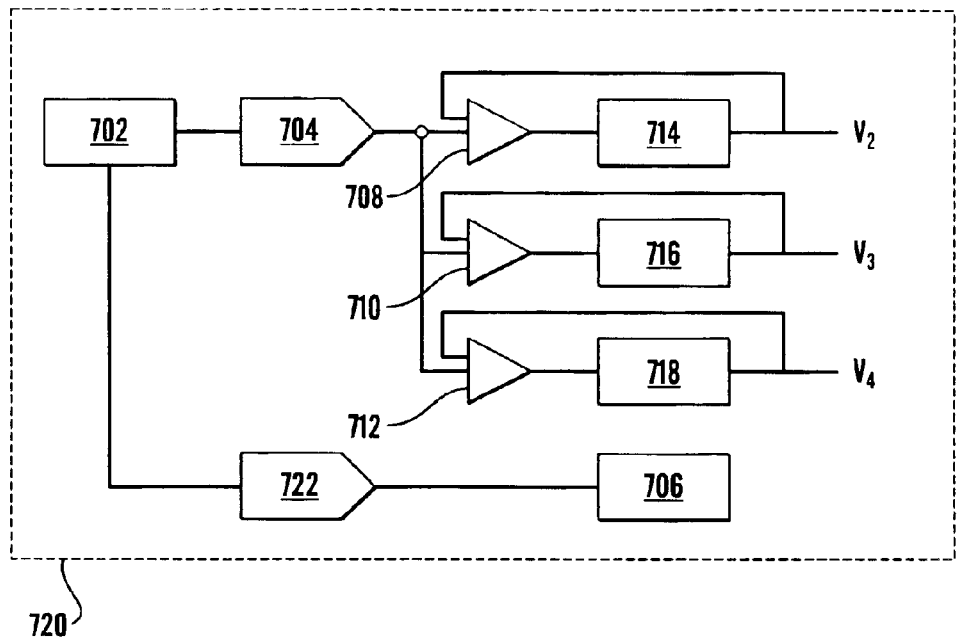
Figure 8:
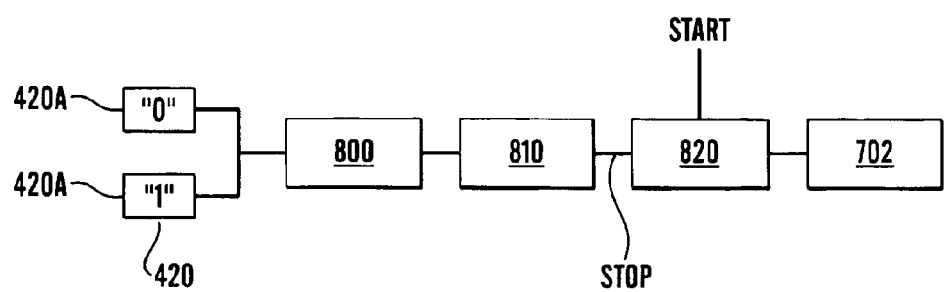
Figure 9:
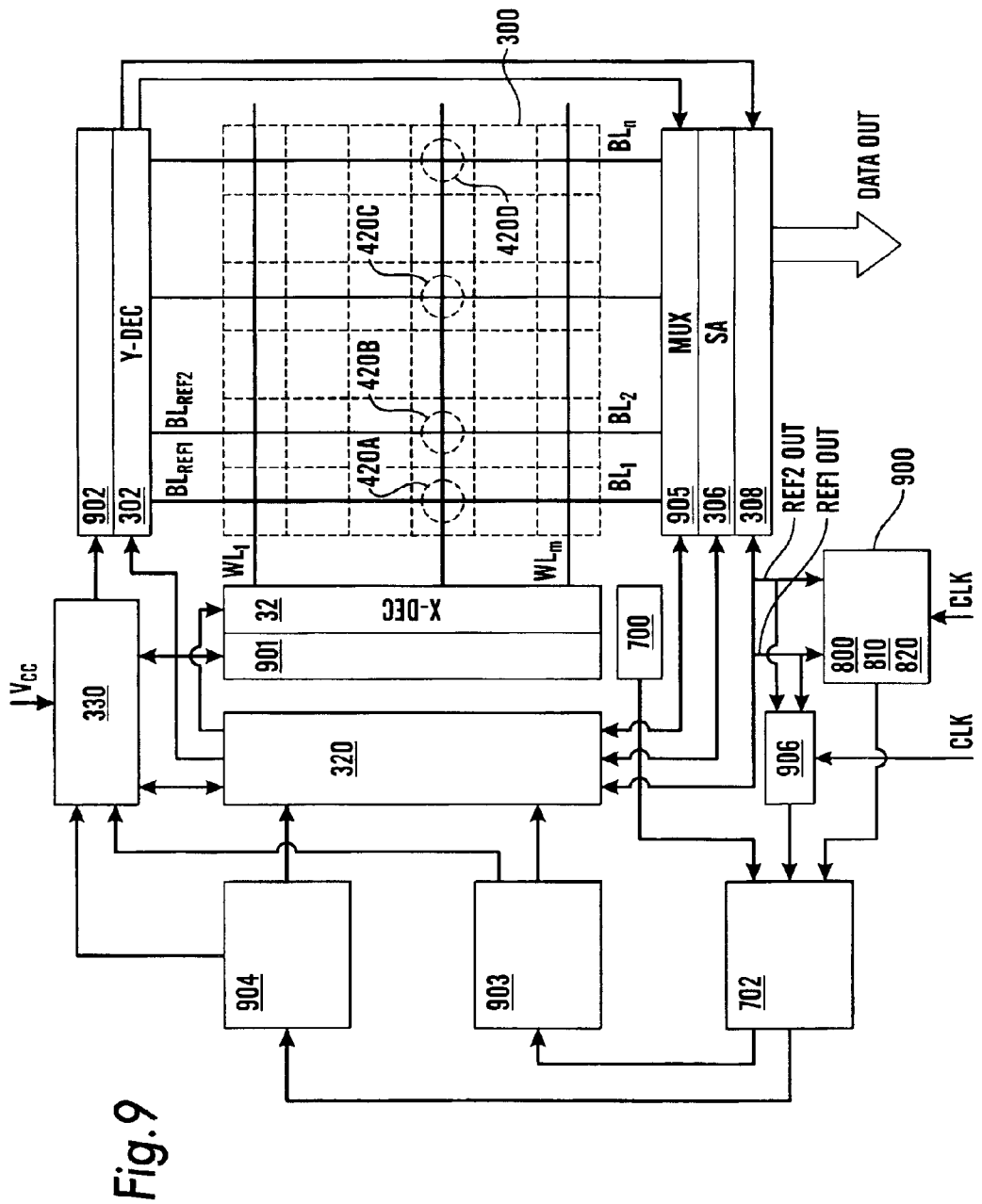

The present invention shall now be explained in greater detail by means of a discussion of exemplary embodiments thereof and in conjunction with the appended drawing figures, of which FIG. 1 shows, as mentioned in the introduction, a schematic hysteresis curve of a ferroelectric memory material;

FIG. 2 as mentioned in the introduction, a comparison of two hysteresis curves belonging to the same ferroelectric memory material and recorded at different temperatures;

FIG. 3 a block diagram illustrating a memory circuit according to the preferred embodiments;

FIG. 4a a principle drawing of a passive matrix addressing arrangement with crossing electrode lines;

FIG. 4b a principle drawing of a passive matrix with cells containing ferroelectric material localized between the overlap of crossing electrode lines;

FIG. 5 a read and write voltage switching protocol with four separate potential levels to be controlled on the word lines and bit lines;

FIG. 6a schematically the magnitudes of the potential levels in a switching protocol as they vary with temperature according to a first preferred embodiment;

FIG. 6b schematically the magnitudes of the potential levels in a switching protocol as they vary with temperature according to a second preferred embodiment;

FIG. 6c schematically the magnitudes of the potential levels in a switching protocol as they vary with temperature according to a third preferred embodiment;

FIG. 7a a block diagram illustrating an analog temperature compensation circuit according to the invention;

FIG. 7b a block diagram illustrating a digital temperature compensation circuit according to the invention;

FIG. 8 a block diagram illustrating an extension to the compensation circuits in FIGS. 7a or 7b for determining an actual switching speed according to the invention, and FIG. 9 a passive matrix-addressable device implementing the method according to the invention.

Before the present invention is explained with reference to preferred embodiments a brief review of its general background shall be given with particular reference to the structure of matrix-addressable ferroelectric memories and how they generally are addressed.

With reference to FIG. 3, it shows in a simplified block diagram form the structure and/or functional elements of a matrix-addressable ferroelectric memory and as can be adapted for the purposes of the present invention. A memory macro 310 consists of a memory array 300, row and column decoders 32; 302, sense amplifiers 306, data latches 308 and redundant word and bit lines 304; 34. The row and column decoders 32; 302 decode the addresses of memory cells while sensing is performed by the sense amplifiers 306. The data latches 308 hold the data until part or all of the data is transferred to the memory control logic 320. The data read from the memory macro 310 will have a certain bit error rate (BER) which can be decreased by replacing defective word and bit lines in the memory array 300 with redundant word and bit lines 304; 34. In order to perform error detection the memory macro 310 may have data fields containing error correction code (ECC) information. The memory control logic 320 module provides a digital interface for the memory macro 310 and controls the reads and writes of the memory array 300. Memory initialisation and logic for replacing defective bit and word lines with redundant word and bit lines 304, 34 will be found in the memory control logic 320 as well. The device controller 330 connects the memory control logic 320 to external bus standards. A charge pump mechanism 340 may be provided for generating some of the voltages needed to read and write the memory cells. A separate clock input, given by the device controller 330 via an oscillator (not shown), will be used by the charge pump mechanism 340 as appropriate to allow charge pumping to remain independent of the bit rate of the application using the memory macro 310.—However, generally the function of the charge pump mechanism will be provided by driver circuits, as shown in FIG. 9.

As the method according to the present invention applies to the voltage pulse protocols used for addressing passive matrix-addressable ferroelectric memories or electret memories wherein the memory material is a ferroelectric or electret polymer, such protocols shall now be more comprehensively discussed in order to elucidate the present invention.

The voltage pulse protocols as applied to the addressing of passive matrix-addressable ferroelectric memories or electret memories wherein the memory material is a ferroelectric or electret polymer, comprise determined pulse sequences with amplitudes set relative to a reference voltage which may be zero and ranging from this value to an appropriate switching voltage, the selection of which may depend on the memory material in question, but which in any case is higher than the coercive voltage. The actual number of voltage levels prescribed by the voltage pulse protocol may be three or even larger and fractional voltages, i.e. voltage levels intermediate between the switching voltage and e.g. zero voltage, are chosen according to a so-called voltage selection rule and preferably either a half or even better a one-third selection rule is used. The voltage selection rule ensures that non-addressed cells and inactive word lines and bit lines are not subjected to voltages or electric fields larger than a given fraction of the switching voltage $V_s$ and that the activation of word lines and bit lines preferably only involves potential adjustments equal to one of the selected fractional voltages. Actually, it has been shown by the applicant that the average minimum voltage level on any word line and bit line in the memory matrix cannot be less than $V_s/3$ and hence there is nothing to gain from employing voltage selection rules with fractional voltage levels smaller than this, e.g. to use a one-fourth selection rule and so on.

In particular it may be useful to explain the application of the voltage pulse protocols and the function of the preferred embodiments in a generalized fashion, with reference to the matrix shown in FIGS. 4a and 4b. In order to conform to standard terminology, it is henceforth referred to the horizontal (row) electrode lines as word lines 400, abbreviated WL and to vertical (column) electrode lines as bit lines 410, abbreviated BL. These reside within e.g. the memory array 300. It is desired to apply a voltage that is sufficiently high to switch a given cell 420, either for defining a given polarization direction in that cell (writing), or for monitoring the preset polarization direction (reading). The ferroelectric material located between the electrodes functions like a ferroelectric capacitor 422. Accordingly, the cell 420 is selected by setting the potentials of the associated word line 402 and bit line 412 (the active lines) such that $$\Phi_{activeBL} - \Phi_{activeWL} = V_S \quad (1)$$

At the same time, the numerous word lines 400 and bit lines 410 that cross at cells 420 not addressed must be controlled with regard to potential such that the disturb voltages at these cells 420 are kept below the threshold for partial switching. Each of these inactive word lines 400 and bit lines 410 crosses the active word line (AWL) 402 and active bit line (ABL) 412 at a non-addressed cell 420. Four distinct classes of cells 420 can be defined in the matrix according to the perceived voltages across the cells 420, namely i) $V_i=\Phi_{activeBL}-\Phi_{activeWL}$ (active word line crossing active bit line), ii) $V_{ii}=\Phi_{inactiveBL}-\Phi_{activeWL}$ (active word line crossing inactive bit line), iii) $V_{iii}=\Phi_{activeBL}-\Phi_{inactiveWL}$ (inactive word line crossing active bit line), and iv) $V_{iv}=\Phi_{inactiveBL}-\Phi_{inactiveWL}$ (inactive word line crossing inactive bit line).

Here i) refers to a selected or addressed cell 430, while ii)–iv) refer to non-selected or non-addressed cells 420, shown in FIG. 4.

In practical devices where it is desired to minimize cost and complexity, it is of primary interest to focus on the special case where all inactive word lines 400 are at a common potential $\Phi_{inactiveWL}$, and correspondingly all inactive bit lines 410 are at a common potential $\Phi_{inactiveBL}$. By summing the voltages around a closed loop in the matrix grid, the following condition applies, viz.

$$V_i=V_{ii}+V_{iii}-V_{iv} \quad (2)$$

Given the value of $V_i=V_S$, the minimum voltage value attainable across the non-addressed cells 420 is thus $$|V_{ii}|=|V_{iii}|=|V_{iv}|=V_S/3 \quad (3)$$

At least four separate potentials are required to achieve this, i.e. ($\Phi_0$, $\Phi_0+V_S/3$, $\Phi_0+2V_S/3$, $\Phi_0+V_S$, where $\Phi_0$ is a reference potential. The potentials must be imposed on the electrodes in the matrix, and any change in potential on one of the electrodes must be coordinated with adjustments in the other potentials such that no cell 420 experiences a voltage exceeding $V_S/3$. In practice, several other factors must be heeded also, e.g. related to minimizing switching transients (charge or discharge currents) and reducing the complexity of the driving circuitry.

There exist other switching protocols as well, e.g. a three-level protocol with $V_S/2$ as the voltage across certain non-addressed cells 420 provided that $V_S/2$ is lower than $V_C$ in that particular case. However, the type of switching protocol used does not limit the invention in any way. The switching protocol shall now be discussed in further detail.

FIG. 5 illustrates a four-level switching protocol comprising a read cycle and a write or refresh cycle. It will be clear from the example that no non-addressed cell experiences a voltage exceeding one third of the nominal switching voltage. The time markers, 0 . . . 10, indicate different activities in the switching protocol depicted in FIG. 5. It is assumed below that $\Phi_0$ equals 0 V. These activities will now be described.

$t_0$ is the quiescent state where all word lines and all bit lines are at two thirds of the nominal switching voltage, $2V_S/3$.

At $t_1$ the inactive bit lines 410 are adjusted from quiescent value to $V_S/3$. This results in voltages across the cells such that $V_{ii}=V_{iv}=-V_S/3$.

At $t_2$ the active bit lines 412 are adjusted to $V_S$ resulting in $V_i=V_{iii}=V_S/3$. All cross-points now experience an absolute value of one third of the nominal switching voltage. The time delay from $t_1$ to $t_2$ is arbitrary and zero or negative timings are acceptable as well.

$t_3$ is the start of the read delay which lasts until $t_4$ and wherein the active word line 402 is pulled down to a 0 V potential. $V_i$ now equals $V_S$ thereby enabling the reading of addressed cells. $V_{iii}$ remains at $V_S/3$ while $V_{ii}$ and $V_{iv}$ remain at $-V_S/3$.

At $t_4$ the read delay has elapsed and the active word line is returned to $2V_S/3$ thereby restoring the situation after $t_2$.

At $t_5$ all bit lines are returned to the quiescent potential. This step is the reversal of steps $t_2$ and $t_3$ taken together. The read cycle has been completed and all word lines and bit lines have returned to the quiescent state similar to $t_0$.

At $t_6$ the inactive word lines 400 are lowered from quiescent value to $V_S/3$ as a first step in the write or refresh cycle. This results in voltages across cells such that $V_{iii}=V_{iv}=V_S/3$.

At $t_7$ the active bit lines which should be written to the logic state "1" are adjusted to 0 V potential while the active bit lines which should remain in the logic state "0" stay at the $2V_S/3$ quiescent potential. Looking only at the write or refresh cycle, active bit lines which should remain in the logic state "0" behave as if they were inactive bit lines, the difference being that during the read cycle they were active bit lines. This is a minor problem of linguistic character that occurs within the territory of destructive read-out memory systems. This results in voltages across cells such that $V_i^{state\ "1"}=-2V_S/3$ while $V_{ii}^{state\ "0"}=V_{ii}=0$ and $V_{iii}^{state\ "1"}=-V_S/3$ and finally $V_{iii}^{state\ "0"}=V_{iv}=V_S/3$. (It can be seen that $V_i^{state\ "1"}$ is now clearly larger than $V_S/3$ and a switch in polarization direction might have begun. However, this is not a problem since the very same cells are intended to be written in the next step.)

$t_8$ is the start of the write or refresh delay which lasts until $t_9$ and wherein the active word line is pulled up to a potential of $V_S$. $V_i^{state\ "1"}$ now equals $-V_S$ thereby enabling the writing or refreshing of the desired cells. $V_i^{state\ "0"}$ and $V_{ii}$=move down to $-V_S/3$ where they join $V_{iii}^{state\ "1"}$. $V_{iii}^{state\ "0"}$ and $V_{iv}$ are still at $V_S/3$.

At $t_9$ the write or refresh delay has elapsed and all the bit lines are returned to $2V_S/3$ leading to $V_i=V_{ii}=-V_S/3$ and $V_{iii}=V_{iv}=V_S/3$.

At $t_{10}$ all word lines are returned to the quiescent potential. This step is the reversal of steps $t_6$ and $t_8$ taken together. The write or refresh cycle has been completed and all word lines and bit lines have returned to the quiescent state similar to $t_0$ and $t_5$.

The switching protocol described in FIG. 5 can be inverted such that all word lines and all bit lines are at one third of the nominal switching voltage, $V_S/3$, in the quiescent state. The active word lines would be set at $V_S$ during the read cycle and at 0 V during the write or refresh cycle. Likewise, the inactive word lines and the bit lines would be modified in a corresponding manner. Apart from the specific voltage levels, the basic features are similar in all switching protocols regardless of the number of levels, and although four levels are used for describing the preferred embodiments it shall be evident that systems with fewer or more levels can benefit from the invention as well.

In connection with the embodiments of the present invention as applied to switching of voltage pulse protocols discussed in the foregoing, there shall below in order to illuminate central aspects of the present invention be discussed exemplary embodiments in relation to a handling the specific problem of a change in the switching properties of a ferroelectric memory materials as the temperature varies.

Particularly this trait is manifest in a decrease in the coercive voltage of field as the temperature increases or generally also in an increase in the switching speed with the temperature, as set forth in the introduction. In the case where the ferroelectric material is a polymer thin film, one has also the problem that it may tend to exhibit less polarization as the Curie point is approached. Moreover, also the previous switching history of the ferroelectric memory material may affect the instantaneous ferroelectric properties, particularly as expressed through the properties of hysteresis loop. Well-known phenomena such as fatigue and imprint which have a detrimental effect on the switching properties of a ferroelectric material may, in case they occur, impart a switching history to the ferroelectric memory material that cannot be neglected when its switching properties at a high temperature shall be considered.

The general solution to the temperature-related increase of the switching speed or the decrease in the coercive voltage of a ferroelectric memory device as proposed by the present invention is to introduce an appropriate temperature compensation in potential levels corresponding to the applied voltage differences in the pulse protocols for addressing in the memory. This presupposes that a temperature of the memory is determined either by direct measurement or by a determination through an indirect method. A direct temperature measurement of the working or operating temperature of a ferroelectric memory device can easily be done by mounting a temperature sensor in the memory circuit or on the memory circuit board, as will be described below. The temperature sensor will then sense the working or environmental temperature of the ferroelectric memory circuit. Ideally the environmental temperature will not necessarily be equated with an actual operating temperature of the memory material itself in an addressing cycle. It is e.g. well-known that the switching of e.g. ferroelectric memory cells of a polymer material may induce thermomechanical stresses in the memory material proper. Particularly in stacked memory architectures as known in the art, both the dissipation of generated heat and the damping of mechanical oscillations can cause problems and at any instant the actual operating temperature of the memory material due to slow heat dissipation, as a matter of fact can be higher than the environmental temperature of the circuit itself. However, it may not be practical to perform a direct sensing of the temperature in the memory layer in the memory material, but as the temperature is related to a switching speed of a memory cell, the switching speed could be measured in an addressing operation and then a predetermined correlation between the switching speed and the temperature of the memory material could be applied for determining the latter. In the following preferred embodiments which all provide for a temperature compensation of one or more potential levels in the pulse protocols shall be described without specific reference to a particular preferred temperature determination, i.e. the temperature can be measured directly or it can be determined in an indirect manner as set out above.

In a first preferred embodiment, the problem of having an operating temperature relatively close to the Curie point of the ferroelectric material is addressed by implementing a temperature coefficient, $k_S(T)$, for altering the nominal switching voltage, $V_S$. The predefined four potential levels $V_1, V_2, V_3, V_4$ are shown in FIG. 5 as dash-dotted horizontal lines, and respectively denoted 610, 620, 630 and 640 as shown in FIGS. 6a–c. As used herein it should be clear that $V_i, V_{ii}, V_{iii}$ and $V_{iv}$ are the voltages perceived across the cells 420, while $V_1, V_2, V_3$ and $V_4$ are the actual potentials, which means that $V_1$ equals $\Phi_0$, $V_4$ equals $\Phi_0+V_S$ etc. A temperature coefficient $k_S(T)$ is applied to all the potentials as shown in formulas below.

$$V_4=\Phi_0+3/3*k_S(T)*V_S \quad (4)$$

$$V_3=\Phi_0+2/3*k_S(T)*V_S \quad (5)$$

$$V_2=\Phi_0+1/3*k_S(T)*V_S \quad (6)$$

$$V_1=\Phi_0+0/3*k_S(T)*V_S \quad (7)$$

The simplest form of temperature coefficient is one which has a linear relationship with the temperature. FIG. 6a is an example of such a temperature coefficient which can be written in the $k_S(T)=a+b*T$ format. The potentials 621, 631, 641 deriving from $V_2, V_3, V_4$ respectively and compensated for temperature are all on an equal relative distance from each other. Depending on the properties of the ferroelectric material in question the temperature coefficient may have non-linear relationships with the temperature, such as $k_S(T)=a+b*T^{0.9}$ or $k_S(T)=a+b*e^{c*T}$. Another option is to use the difference between the operating temperature and the Curie temperature. These advanced options may become necessary since the difference between the operating temperature and the Curie temperature is much smaller for ferroelectric polymers. Consequently, it is not recommended to only rely upon the negative temperature dependency of a zener diode as is taught in U.S. Pat. No. 5,550,770. The mathematical operations for determining the temperature coefficient at any time may be performed within the ferroelectric memory device, e.g. in the memory control logic 320, or may take place outside the ferroelectric memory device and incorporated simply in the form of look-up tables. If the memory device in question is small, the look-up tables may be reduced.

In a second preferred embodiment, the problem of having an operating temperature in relative proximity to the Curie point of the ferroelectric material is addressed by introducing an offset voltage to one or more of the potential levels. One example of using offset voltages is given in the published International Patent Application No. WO 02/05287 where a low parasitic current load on the bit line during read operations is achieved by adding an offset voltage to the inactive word lines 400 and inactive bit lines 410. The result is that $V_{ii}$ becomes $V_{ii}+\delta$ and that $V_{iii}$ becomes $V_{iii}-\delta$. However, the magnitude of $\delta$ must be selected carefully since the perceived voltage across cells 420 where inactive lines cross active lines, in either combination, becomes greater at certain times, thus increasing the risk of an undesired reversal of the polarization direction.

The present invention, on the other hand, adds an offset voltage $\delta V$ to one or two potential levels. In the formulas below, an offset voltage $\delta V$ has been added to $V_2$ in order to decrease the perceived voltage across cells 420 where inactive word lines 400 cross inactive bit lines 410. Such cross-points constitute the majority of the memory array 300 and help the most in reducing undesired reversal of the polarization direction although the magnitude of $\delta$ must still be selected carefully.

$$V_4=\Phi_0+3/3*V_S \quad (8)$$

$$V_3=\Phi_0+2/3*V_S \quad (9)$$

$$V_2=\Phi_0+1/3*V_S+\delta V \quad (10)$$

$$V_1=\Phi_0+0/3*V_S \quad (11)$$

In FIG. 6b the added offset voltage $\delta V$ is shown effecting an increase of the adjusted potential 622 above the dash-dotted representation of the original potential 620. Alternatively, there can be a simultaneous reduction of the potential 630 by an offset voltage 6V resulting in an adjusted potential 632. Similar to the temperature coefficient of the first preferred embodiment, the offset voltage may vary with temperature. This variation turns up on the adjusted potential 632 as shown in FIG. 6b. In contrast with the first preferred embodiment, the potentials 622, 632 compensated for temperature are not on equal relative distances from each other any longer.

In a third preferred embodiment of the invention, a combination of a temperature coefficient $k_S(T)$ and an offset voltage δV is employed. FIG. 6c shows the influence of the temperature coefficient on the adjusted potentials 621, 631, 641 corresponding to those in FIG. 6a, while the total effect, with the offset voltage δV as well, is given as the further adjusted potentials 623, 633.

The three preferred embodiments described above may all be provided with circuitry according to FIGS. 7a and 7b wherein a temperature sensor is used for sensing a working of environmental temperature that would be suitable for determining a circuit working temperature. FIG. 7a shows an analog temperature compensation circuit 700 that could fit e.g. inside the charge pump mechanism 340. A calibration memory 702 provides information about temperature coefficient and/or offset voltage(s) to a digital-to-analog converter (DAC) 704. Together with input from a temperature sensor 706 the converted information is run through a set of comparators 708, 710, 712. As a result, charge pumps 714, 716, 718 control the potentials $V_2$, $V_3$ and $V_4$. It is customary to connect $V_1$ to the ground, thereby setting $\Phi_0=0$ V.

FIG. 7b shows a digital temperature compensation circuit 720 that could also fit e.g. inside the charge pump mechanism 340. Input from the temperature sensor 706 is sent to the calibration memory 702 via an analog-to-digital (ADC) converter 722. Data from the correct address in the calibration memory 702 is provided to the digital-to-analog converter (DAC) 704 and run through the set of comparators 708, 710, 712. Again, charge pumps 714, 716, 718 control the potentials $V_2$, $V_3$ and $V_4$, while $V_1$ is connected to the ground, thereby setting $\Phi_0=0$ V.

The circuits of FIGS. 7a and 7b can be altered to accommodate switching protocols with more or fewer levels as well as switching protocols where $\Phi_0$ does not equal zero. It shall be clear that the number of comparators 708, 710, 712 or charge pumps 714, 716, 718 may vary as a result of the number of levels or whether $\Phi_0$ equals zero or not.

As stated above the three preferred embodiments described above also can be used in conjunction with the indirect determination of an operating temperature, which in this case would be the actual operating temperature of the memory medium itself during addressing or switching operations. This shall take place by means of an indirect procedure based on measuring the switching speed of memory cells as shall be explained with reference to FIG. 8.

FIG. 8 shows a system for indirect determination of the working temperature of the ferroelectric memory device. Two memory cells 420A;420B are used as reference cells. These reference cells may be located in the memory array 300 or provided on a separate reference memory array. One of the cells is set to a logic "0" and the other cell is set to a logic "1". During operation, both of the reference cells are read out. A level detector 800 continuously subtracts the charge density of the "1" reference cell from the charge density of the "0" reference cell. This type of arrangement has been described in the published International Patent Application No. WO 02/05288 (Nordal & al.). The difference between the charge densities increases with time as the readout proceeds. However, the difference between the charge densities is affected by the operating environment as well, i.e. temperature, moisture etc. A comparator 810 compares the difference between the charge densities with a predetermined value and sends a stop signal to a counter 820. The counter 820 begins counting when the readout operation starts. The time elapsed is then forwarded to the calibration memory 702 in order to determine the operating temperature that corresponds with the time needed for the difference between the charge densities to reach the predetermined level.

Now a fourth embodiment of the invention shall be described in which the adjustment of the voltage pulses as applied in a voltage pulse protocol is not performed on the amplitudes, but on the pulse lengths. The voltage pulse protocol is in other words adjusted in such a way that at least a switching pulse length is reduced in proportion to an increase in the switching speed. This increase could of course be due to a temperature-dependent increase in the switching speed, but generally it can be relied on the switching speed as a parameter of a memory cell's response that is influenced by a result of addressing operation carried out, changes in the memory cell's properties and various environmental factors in addition to the temperature. By reducing for instance the pulse lengths as switching speed increases, a readout signal will not be seriously diminished at high temperatures, while the effect of disturb voltages to non-addressed memory cells is reduced. In order to achieve a pulse-length control the memory device must comprise a pulse-length controller, which adjusts the pulse lengths in the voltage pulse protocols and preferably this will be done in response to information of the actual switching speed. As of course the given pulse protocol comprises sequences of pulses with different pulse parameters such as lengths, polarities, pulse intervals, the adjustment of pulse length may vary with the type of pulse used in a given pulse protocol. In practice the adjustment of the pulse length could also be seen as an adjustment of the timing sequence in a pulse protocol or at least a part of this timing sequence, e.g. adjustment of pulse lengths may be combined with adjustments in the pulse intervals, i.e. the time between the different pulses in the protocol. As before adjustments can be made on the basis of the temperature measurements simply by using a sensor as set out above and measuring the temperature directly while the pulse length adjustment is then found by using a look-up table. Even more preferably the switching speed can be determined by addressing and monitoring one or more reference or test memory cells connected in a matrix the same way as memory cells used for ordinary data storage, and the switching speed will then be used as a parameter indicative of the memory cell's response as found by simply carrying out an addressing operation for read operation or addressing operation for the reference memory cells. The advantage of using switching speed is that the change thereof shall incorporate the effect or other factors than the temperature, such as humidity, pressure, mechanical stresses and so on.

With reference to FIG. 9 a discussion of a ferroelectric memory device adapted for implementing the method according to the invention shall be given. Some of its component parts have already been discussed in connection with FIG. 3 and shall hence only be briefly mentioned. As before the memory matrix 300 comprises memory cells 420 between or at a crossings of word lined WL and bit lines BL in the matrix. The matrix is shown as an m·n matrix, i.e. with m word lines WL and n bit lines BL. The bit lines BL are connected to a sense amplifier bank 306, comprising a plurality of sense amplifiers SA and each connected with a bit line BL, thus allowing a full row read. However, in order to reduce the number of sense amplifiers the word lines may be segmented such that each segment comprises a certain number n/k of bit lines BL, where k is an integer, and correspondingly the sense amplifier bank 306 then shall comprise n/k sense amplifiers. This implies that a multiplexer 905 must be provided for connecting each bit line on an addressed segment to one of the sense amplifiers SA for enabling a parallel read or write to all memory cells in word lines segment as is the case. In other words, the multiplexer 905 shall not be provided in case the memory device supports a full row addressing, i.e. to all memory cells on a word line in parallel. The driver circuits viz. the x-driver 901 and the y-driver 902 may replace the charge pump mechanism 340 in FIG. 3, but are generally provided for applying the voltage pulses according to the given voltage pulse protocol to respectively the word lines WL and the bit lines BL. The selection of memory cells 420 e.g. read or write operation takes place directly in the addressing operation viz. the x-decoder 901 and the y-decoder 902, whereby preferably word lines WL and bit lines BL may be selected as active by respectively a pull-up or pull-down from the same permanent quiescent voltage level chosen as a fraction of switching voltage $V_S$ referred to zero (or floating ground), while inactive word lines and bit lines remain on quiescent potential or are pulled to another fractional voltage referred to $V_S$. On bit lines $BL_{ref1}$ and $BL_{ref2}$ there are shown two reference memory cells 420A and 420B which may be set to respectively the first and the second polarization state, i.e. in other words represent a logical 0 and a logical 1. The reference cells 420A and 420B are connected with bit lines $BL_{ref1}$ and $BL_{ref2}$ and form a part of the memory matrix in the same manner as the other memory cells 420 and hence will be subjected to same disturbing influences or dynamic changes that may occur in the other memory cells, whether due to addressing operations, environmental factors and so on.—It should be understood that a pair of reference cells may be provided on every word line WL in a similar manner.—The reference memory cells 420A and 420B are addressed in a read operation and the result is detected via the sense amplifier bank 306 and output to the unit 900 for determining a switching speed. Consequently unit 900 has a clock input CLK. The switching speed is output to the calibration memory 702 which has an output connected with a pulse length controller 903, while as before another output is connected to the pulse amplitude controller 904, both controllers 903, 904 of course being connected to the memory control logic 320. The memory device in addition may comprise a temperature sensor 706 for sensing an operating temperature of the memory and likewise of course with its output connected to the calibration memory 702.

As an optional feature a signal analyser 906 with clock input CLK is shown connected with output from the reference memory cells 420A, 420B and can be used for carrying out a more sophisticated analysis, not only of the switching speed characteristics, but e.g. also in regard of polarization response characteristics of the memory cells. The output of the signal analyser 906 is connected with the calibration memory 702.

The calibration memory 702 will now store the measured reference values, possibly also a history vector for the same referring to addressing and referencing operations carried out earlier, and shall moreover derive correction values for either pulse lengths, or pulse intervals or pulse amplitudes, said values being input to the pulse length controller 903 or the pulse amplitude controller 904 as is the case. The pulse length will be adjusted by some amount $\pm\delta t$ while the pulse amplitudes will similarly be adjusted by an amount $\pm\delta V$. It shall be understood that e.g. a pulse generator shall input pulses with determined amplitude and/or length as determined the driver control unit 330 and control parameters deriving from the pulse length controller 903 and the pulse amplitude controller 904 could be applied directly to a pulse generator for applying the actual control values to the amplitude or pulse length or both, as stated, and it is evident that the simultaneous adjustment of both pulse amplitude and pulse length can be performed when the control units 903, 904 are operating synchronized. It shall also be understood that the component 900 in FIG. 9 will be identical or more or less be similar to the component diagram that is shown in FIG. 8, while the calibration memory 702 will be common to either kind of controlling operation. This implies that the control units 903, 904 advantageously both will form component parts of a pulse generator which adjusts a pulse lengths and pulse amplitudes with correction values as derived in the calibration memory 702. The pulse length can appropriately be set by applying a timing control as known in the art, while pulse amplitude control can be achieved by means of charge pumps set to adjust the voltage with the control value amounting to $\pm\delta V$ as is the case.—In practice the charge pump function here is implemented by the driver circuits, i.e. the x-driver 901 or the y-driver 902 under control of the driver control unit 320, which is fed the supply voltage $V_{CC}$ from an appropriate source.

Concerning other component parts of the memory device FIG. 9 they shall mimic similar components in FIG. 3. However, it is taken for granted that their function in a memory device of this kind will be obvious to persons skilled in the art and hence need not be elaborated further. Finally, it should be noted that an adjustment of the voltage pulse protocol dependent on to changes in the memory cell response shall serve to reduce disturb voltages (i.e. transient voltages generated by e.g. capacitive couplings or sneak currents in the cross-point matrix) to non-addressed memory cell during an addressing operation. It should also be noted that similar procedures will serve to obviate the effect of both fatigue and imprint to which a memory cell may be much more prone at a higher switching speed or reduction in the coercive field, e.g. ensuing from an increase in the temperature.

Although the various preferred embodiments discussed hereinabove in particular refers to ferroelectrics, it is to be understood that the present invention mutatis mutandis can be applied to any electret material exhibiting a general dipolar polarization behaviour and wherein the polarization response changes in systematic fashion during the operation of the memory device, irrespective whether this is caused by environmental factors or the actual addressing history.

What is claimed is:

1. A method for operating a ferroelectric or electret memory device, wherein the memory device comprises memory cells in the form of a ferroelectric or electret thin-film polarizable material exhibiting hysteresis, particularly a ferroelectric or electret polymer thin film, and a first and a second set of respective parallel electrodes, wherein the electrodes of the first set are provided in substantially orthogonal relationship to the electrodes of the second set, wherein the electrodes of said first and second set are provided in direct or indirect contact with the thin-film material of the memory cells, whereby a polarization state in individual memory cells can be read, refreshed, erased or written by applying appropriate voltages to the individual electrodes of respectively said first and second set of electrodes, wherein the method implements a voltage pulse protocol comprising a read and write/refresh cycle respectively with time sequences of voltage pulses of predefined amplitudes and lengths, wherein a read cycle comprises applying a set of voltage differences to electrodes of respectively said first and second set of electrodes in case data are read out from the memory cells, wherein the write/refresh cycle of the voltage pulse protocol comprises applying another set of voltage differences to electrodes of respectively said first and second set of electrodes in case data are written/refreshed to said memory cells, said sets of voltage differences corresponding to a predefined set of potential levels such that the predefined set of potential levels has at least three separate values, the method comprising:
- a) determining at least one parameter indicative of a change in a memory cell response to the applied voltage differences;
- b) determining at least one correction factor for the voltage pulses as given by the voltage pulse protocol on the basis of said at least one parameter indicative of the change in a memory cell response to the applied voltage differences;
- c) selecting for an adaptation of the voltage pulse protocol at least one of the following pulse protocol parameters, viz. pulse amplitudes, pulse lengths and pulse intervals; and
- d) adjusting one or more parameter values of at least one of said selected pulse protocol parameters in accordance with said at least one correction factor, whereby one or more pulse amplitudes, one or more pulse lengths, and one or more pulse intervals are adjusted either separately or in combination in accordance with a detected change in the memory cell response.

2. The method according to claim 1,
further comprising adjusting the values of the pulse amplitude and/or the pulse length of a switching voltage pulse in the voltage pulse protocol.

3. The method according to claim 1,
wherein determining said at least one parameter indicative of a response change in step a) includes determining at least one parameter indicative of a switching speed of said ferroelectric memory, and wherein determining said at least one correction factor in step b) includes determining a switching speed-dependent correction factor.

4. The method according to claim 3,
wherein determining said at least one parameter indicative of the switching speed in step a) includes measuring an instantaneous switching speed of said ferroelectric memory.

5. The method according to claim 4,
wherein measuring said switching speed includes measuring the switching speed of one or more reference memory cells.

6. The method according to claim 4,
wherein measuring said switching speed includes analysing ongoing addressing operations including a switching of memory cells in the ferroelectric memory device.

7. The method according to claim 3,
wherein determining said at least one parameter indicative of the switching speed in step a) includes:
continuously monitoring the switching speed of the ferroelectric memory device;
applying at least one switching speed-dependent correction factor to the voltage pulse protocol implementing the applied voltage differences;
adapting the voltage pulse protocol in real time to a change in the response to the applied voltage differences; and
applying said real time-adapted voltage pulse protocol for adjusting at least one of the parameter values of the pulse protocol parameters in step d).

8. The method according to claim 7,
wherein all parameter values of at least one of the pulse protocol parameters in step d) are adjusted.

9. The method according to claim 3,
wherein determining the switching speed-dependent correction factor in step b) includes calculating the switching speed-dependent correcting factor.

10. The method according to claim 3,
wherein determining the switching speed-dependent correction factor in step b) includes reading a look-up table.

11. The method according to claim 3,
wherein step b) includes determining a first and a second switching speed-dependent correction factors.

12. The method according to claim 1,
wherein determining said at least one parameter indicative of a response change in step a) includes determining at least one parameter indicative of a temperature of said memory device, and wherein determining said at least one correction factor in step b) includes determining at least one temperature-dependent correction factor.

13. The method according to claim 12,
wherein determining said at least one parameter indicative of the temperature in step a) includes sensing an operating temperature of said ferroelectric memory device directly.

14. The method according to claim 12,
wherein determining a temperature-dependent correction factor in step b) includes calculating the temperature-dependent correction factor.

15. The method according to claim 12,
wherein determining a temperature-dependent correction factor in step b) includes reading a look-up table.

16. The method according to claim 12,
wherein step b) includes determining a first and a second temperature-dependent correction factors.

17. The method according to claim 16,
wherein the first temperature-dependent correction factor is a temperature coefficient, said temperature coefficient being applied for adjusting all parameter values of at least one of the pulse protocol parameters in step d).

18. The method according to claim 16,
wherein the second temperature-dependent correction factor is an offset voltage, said offset voltage being applied for adjusting at least one amplitude value or potential level in step d).

19. The method according to claim 16,
wherein adjusting parameter values in step d) includes performing a first adjustment in accordance with the first temperature-dependent correction factor and thereafter performing a second adjustment in accordance with the second temperature-dependent correction factor, or alternatively performing a first adjustment in accordance with the second temperature-dependent correction factor followed by a second adjustment in accordance with the first temperature-dependent correction factor.

20. The method according to claim 1,
wherein determining said least one parameter indicative of a response change in step a) includes determining at least one parameter indicative of the temperature of said memory device by measuring a switching speed of memory cells in the device and applying a predetermined correlation between the measured switching speed and the actual temperature of the memory material of the cells for determining the latter.

21. The method according to claim 20,
wherein measuring said switching speed includes measuring the switching speed of one or more reference memory cells.

22. The method according to claim 20, wherein measuring said switching speed taking place by analysing ongoing addressing operations inducing a switching of memory cells in the ferroelectric memory device.

23. A ferroelectric or electret memory device, wherein the memory device comprises memory cells in the form of a ferroelectric or electret thin-film polarizable material exhibiting hysteresis, particularly a ferroelectric or electret polymer thin film, and a first and a second set of respective parallel electrodes, wherein the electrodes of the first set are provided in substantially orthogonal relationship to the electrodes of the second set, wherein the electrodes of said first and second set are provided in direct or indirect contact with the thin-film material of the memory cells, whereby a polarization state in individual memory cells can be read, refreshed, erased or written by applying appropriate voltages to the individual electrodes of respectively said first and second set of electrodes, wherein the method implements a voltage pulse protocol comprising a read and write/refresh cycle respectively with time sequences of voltage pulses of predefined amplitudes and lengths, wherein a read cycle comprises applying a set of voltage differences to electrodes of respectively said first and second set of electrodes in case data are read out from the memory cells, wherein the write/refresh cycle of the voltage pulse protocol comprises applying another set of voltage differences to electrodes of respectively said first and second set of electrodes in case data are written/refreshed to said memory cells, said sets of voltage differences corresponding to a predefined set of potential levels such that the predefined set of potential levels has at least three separate values, and wherein a driver control unit is provided for applying via driver circuits the predefined set of potential levels to the electrodes for effecting the above-mentioned operations on selected memory cells according to the voltage pulse protocol for read and write/refresh operations, comprising:

means for determining at least one parameter indicative of a change in the memory cell response to the applied voltage differences;

a calibration memory connected with an output of said means for determining at least one correction factor based on said parameter indicative of the change in the memory cell response; and one or more control circuits connected with an output of the calibration memory for applying an adjustment of one or more parameter values of at least one voltage pulse protocol parameter, said one or more control circuits being connected to control inputs on a memory control unit and/or a driver control unit, whereby the voltage pulse protocol with one or more parameters adjusted in accordance with the change in the memory cell response can be applied to the electrodes of the memory device via driver circuits and decoder circuits connected between the outputs of the driver control unit and the electrodes.

24. The memory device of claim 23, wherein said means is connected with one or more pairs of reference memory cells in the memory device.

25. The memory device of claim 23, further comprising a signal analyser provided and connected between a sense amplifier bank and the calibration memory for performing an analysis of response of the memory cells to read or write/refresh operations executed thereon.

26. The memory device of claim 23, wherein said means comprises a temperature sensor for sensing an operating temperature of the ferroelectric memory device.

27. The memory device of claim 26, wherein said temperature sensor, said calibration memory and a set of driver circuits are all located within an analog temperature compensation circuit.

28. The memory device of claim 26, wherein said temperature sensor, said calibration memory and a set of driver circuits are all located within a digital temperature compensation circuit.

* * * * *